United States Patent
Hajnal

(12) 
(10) Patent No.: US 6,385,478 B1
(45) Date of Patent: May 7, 2002

(54) MAGNETIC RESONANCE IMAGING APPARATUS

(75) Inventor: Joseph Vilmos Hajnal, London (GB)

(73) Assignee: Picker International, Inc., Cleveland, OH (US)

( * ) Notice: Subject to any disclaimer, the term of this patent is extended or adjusted under 35 U.S.C. 154(b) by 0 days.

(21) Appl. No.: 09/469,067

(22) Filed: Dec. 21, 1999

(30) Foreign Application Priority Data

Dec. 24, 1998 (GB) .............................. 9828425

(51) Int. Cl.$^7$ .............................. A61B 5/055
(52) U.S. Cl. .................. 600/410; 600/415; 324/309
(58) Field of Search .................. 600/410, 419, 600/415; 324/306, 307, 309

(56) References Cited

U.S. PATENT DOCUMENTS

| | | | |
|---|---|---|---|
| 4,770,182 A | | 9/1988 | Damadian et al. |
| 5,498,961 A | * | 3/1996 | Kuhn et al. .................. 324/309 |
| 5,631,560 A | | 5/1997 | Machida |

FOREIGN PATENT DOCUMENTS

| | | |
|---|---|---|
| DE | 0 430 322 A2 | 11/1989 |
| EP | 0 654 675 A1 | 5/1995 |
| GB | 2 039 055 A | 7/1980 |
| GB | 2 101 327 A | 1/1983 |

OTHER PUBLICATIONS

Korin, et al.; "Compensation for Effects of Linear Motion in MR Imaging;" *Magnetic Resonance in Medicine* Oct. 12, 1989, No. 1, Duluth, MN, US.

* cited by examiner

*Primary Examiner*—Ruth S. Smith
(74) *Attorney, Agent, or Firm*—Eugene E. Clair; John J. Fry

(57) ABSTRACT

In a magnetic resonance imaging apparatus in which excitation pulses are applied to a restricted region 5 of a magnetic resonance imaging magnet bore, in which the field is uniform, and the data samples collected are Fourier transformed to form a volumetric image of the restricted region, a motor 6 continuously moves a patient couch 3 so that a region of interest passes through the region of good field, and the data samples collected are corrected to compensate for the motion so that a volumetric image is formed of greater length than that of the restricted region.

20 Claims, 3 Drawing Sheets

MAGNETIC RESONANCE IMAGING APPARATUS

BACKGROUND OF THE INVENTION

The present invention relates to a magnetic resonance (MR) imaging apparatus and is particularly related to an apparatus that corrects image data samples to compensate for the motion of an object being imaged to provide a volumetric image larger than a restricted region of a main magnetic field. In magnetic resonance imaging, the subject to be imaged is positioned in a strong magnetic field, for example, produced in the bore of a superconducting electromagnet, and the protons of hydrogen atoms (and of other MR active nuclei) in water and fat align parallel and anti-parallel to the main magnetic field, precessing around the direction of the field at the Larmor frequency.

A transmit coil applies pulses of r.f. energy at the Larmor frequency in a direction orthogonal to the main field to excite precessing nuclei to resonance, which results in the net magnetisation of all MR active nuclei being flipped from the direction of the main magnetic field into a direction having a transverse component in which it can be detected by the use of a receive coil.

The received signal can be spatially encoded to produce two-dimensional (slice) or three-dimensional (slab) information about the distribution of MR active nuclei and hence of water and tissue.

The received signal can be confined to a slice of the patient in the following way.

Referring to FIGS. 1 and 2, a superconducting electromagnet 1 (seen in side view in FIG. 1 and in end view in FIG. 2) has a bore 2 for receiving a patient supported on a couch 3 which can be slid into the bore of the magnet from a position outside. By making the strength of the main magnetic field vary along the length of the bore (the z-axis) using magnetic field gradient coils to increase and/or decrease the main magnetic field, it is possible to excite MR active nuclei (the remainder of this description refers hydrogen nuclei as an example) confined to a slice orthogonal to the z-direction, since the Larmor frequency depends upon the strength of the magnetic field, and the frequency of the r.f. pulse can be chosen to correspond to that frequency. (Gradients could equally be set up to excite slices orthogonal to the x or y axes).

Spatial encoding of the slice can be produced by x and y magnetic field gradient coils which alter the strength, but not the direction, of the main magnetic field, in the x and y-directions. The frequency and phase information in the received signal can be analysed to map the distribution of the hydrogen nuclei in the plane of the slice.

Slab (or three-dimensional) imaging can be performed by commonly exciting a region with the r.f. excitation pulses that is to be divided into a contiguous series of slices using the phase of the received signal to distinguish between these different slices.

It is also known to image contiguous slabs, particularly when attempting to trace vessels such as blood vessels. In one known MRI apparatus, in order to be able to image along the length of the leg, three separate slab images are recorded. The patient is moved to three separate axial positions for the data to be captured. The three images are then joined together. However, there are discontinuities in the images when viewed in a projection normal to the slab boundaries, which is just the direction in which vessels would be viewed in.

It might be wondered why the three multi-slab images could not be acquired without moving the patient, since the length of the bore of the superconducting electromagnet is typically much greater than the length of a leg. However, the region of good field, over which the field is sufficiently uniform to obtain acceptably undistorted images is much smaller than the overall length of the bore. Typically, the region of good field would be an approximately spherical volume 4 in the centre of the bore.

While it is medically desirable to be able to collect three-dimensional image data from an elongated region, the trend in terms of electromagnets makes this more difficult to achieve, since patients find shorter magnets to be more acceptable, and shorter magnets have a region of good field 5 which is compressed in the axial direction, although not in directions at right angles.

SUMMARY OF THE INVENTION

The invention provides magnetic resonance imaging apparatus comprising means for applying r.f. excitation pulses to, and collecting volumetric data samples from, a restricted region of the main field of the apparatus, transforming the data samples to form a volumetric image of the restricted region, including means for advancing a patient support continuously through the restricted region, and means for correcting the data samples to compensate for the motion so that the volumetric image formed is of greater length than that of the restricted region.

The invention enables a shorter electromagnet with a restricted length of good field to produce extended three-dimensional images.

Advantageously, volumetric data samples are encoded with secondary phase encoding in the direction of motion of the patient support and with primary phase encoding which may have a greater number of increments in a transverse direction, the correcting means being arranged to compensate successive sets of samples of all secondary phases produced at each primary phase for the motion.

The present invention provides the foregoing and other features hereinafter described and particularly pointed out in the claims. The following description and accompanying drawings set forth certain illustrative embodiments of the invention. It is to be appreciated that different embodiments of the invention may take form in various components and arrangements of components. These described embodiments being indicative of but a few of the various ways in which the principles of the invention may be employed. The drawings are only for the purpose of illustrating a preferred embodiment and are not to be construed as limiting the invention.

BRIEF DESCRIPTION OF THE DRAWINGS

The foregoing and other features and advantages of the present invention will become apparent to those skilled in the art to which the present invention relates upon consideration of the following detailed description of a preferred embodiment of the invention with reference to the accompanying drawings, wherein:

FIG. 6a is a perspective view of a three-dimensional array of data samples in k-space;

FIG. 6b is a front view of a two-dimensional array of data sample in k-space corresponding to a single slice of the three-dimensional array of FIG. 6a;

Like parts have been given like reference numerals throughout all the figures.

DETAILED DESCRIPTION

Figure 1:
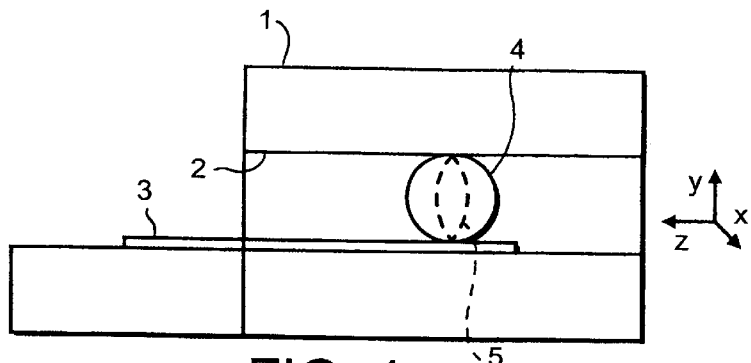
FIG. 1 is a simplified side view of a known magnetic resonance imaging apparatus.
Figure 2:
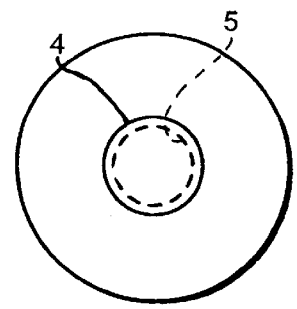
FIG. 2 is a simplified end view of a known magnetic resonance imaging apparatus.
Figure 3:
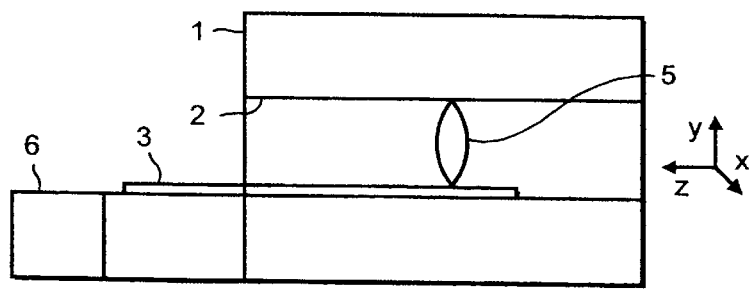
FIG. 3 is a simplified side view of a magnetic resonance imaging apparatus according to the invention.

Referring to FIG. 3, the magnetic resonance imaging apparatus of the invention comprises an electromagnet 1 which is superconducting, but could if desired be resistive. The magnet has a bore 2. Those parts of a patient on a couch 3 which are desired to be imaged are translated through a region of good field of the magnet 5, in which the magnetic field is sufficiently uniform for imaging to be possible with acceptable spatial distortion.

Figure 9:
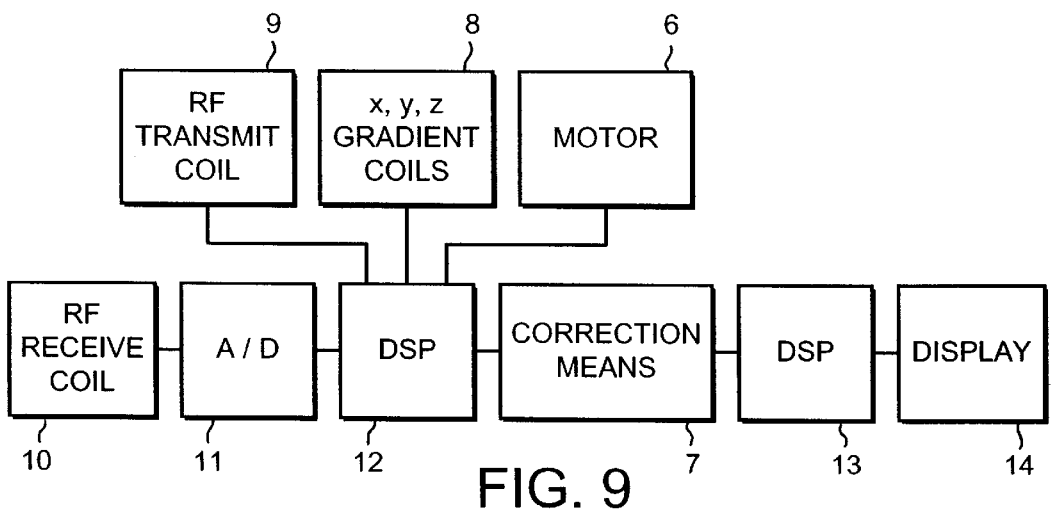
FIG. 9 is a block diagram showing the architecture of the data processing circuitry of the imaging apparatus of FIG. 3.

In accordance with the invention, a motor 6 is provided for moving the couch 3 from a reception position outside the bore into the bore such that the parts of the patient to be imaged are translated through the region of good field 5. And, referring to the architecture of the data processing circuitry of FIG. 9, the data processing circuitry includes correction means 7 provided for correcting the data samples collected, as described in detail below, to compensate for this motion.

The superconducting magnet of the imaging apparatus has a main field in the z-direction and is provided with a z-gradient coil for setting up a magnetic field gradient along the z-direction. X and y-gradient coils are also provided to enable magnetic field gradients to be set up in the x and y-directions as required.

An r.f. transmit coil 9 is provided to apply r.f. excitation pulses to restricted regions within the region of good field 5, and an r.f. receive coil 10 is provided to detect the resulting relaxation signals, which are digitised in A-D converter 11 and fed to digital signal processor 12 which assembles a notional three-dimensional array of data in k-space. Three-dimensional Fourier transformation takes place in digital signal processor 13 to convert the k-space array to an array in real space, and this data is passed to display 14.

Figure 4:
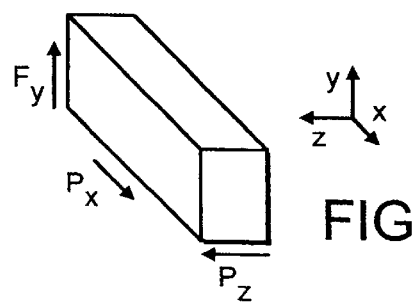
FIG. 4 is a perspective view of a slab to be imaged in the magnetic resonance imaging apparatus of FIG. 3.
Figure 5A:
FIG. 5a illustrates schematically the r.f. pulse of a pulse sequence of the magnetic resonance imaging apparatus of FIG. 3.
Figure 5B:
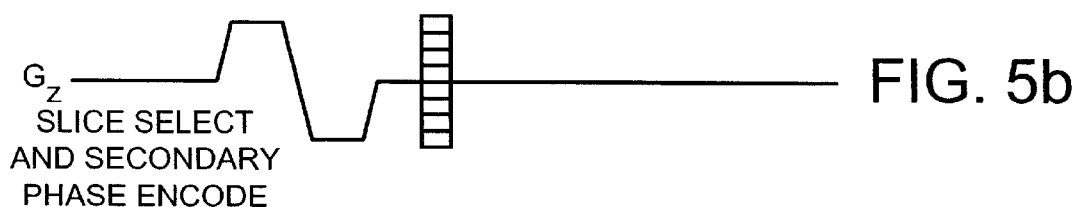
FIG. 5b illustrates schematically the z-gradient pulse of the pulse sequence of the magnetic resonance imaging apparatus of FIG. 3.
Figure 5C:
FIG. 5c illustrates schematically the x-gradient pulse of the pulse sequence of the magnetic resonance imaging apparatus of FIG. 3.
Figure 5D:
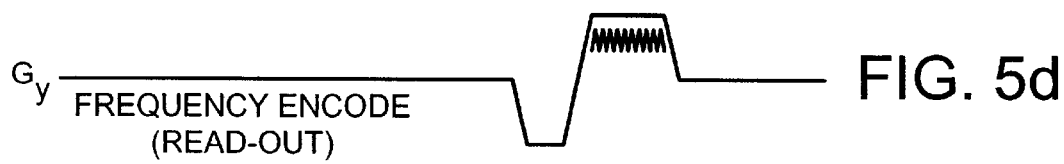
FIG. 5d illustrates schematically the y-gradient pulse of the pulse sequence of the magnetic resonance imaging apparatus of FIG. 3.

Referring to FIG. 4, consider a slab of volume within the region of good field 5 which it is desired to image. The pulse sequence is shown in FIGS. 5a to 5d. In each repetition time (TR), an r.f. pulse, typically of flip angle between 10 and 50° is applied to the patient of which the region shown in FIG. 4 defines a slab, and the resulting echo signals are received while a magnetic field gradient in the y-frequency encode direction is being applied. This means that the echo signals, which consist of a combination of frequencies, can be analysed by Fourier transformation to detect the distribution of hydrogen nuclei in the y-direction. Accordingly, the y-direction is frequency encoded (Fy) in FIG. 4. The readout gradient Gy is preceded by a negative lobe to cancel the de-phasing of spins produced during the readout portion. The other transverse direction, the x-direction, is decoded by means of phase encoding, denoted by Px. Typically there may be 256 increments of phase, and a separate readout Gy is performed for each of them.

The longitudinal position of the particular slice being imaged is determined by the z-gradient (FIG. 5b) but, since this is slab imaging, in fact a contiguous series of slices are encoded, and so the Gz gradient energises hydrogen nuclei in the slab illustrated in FIG. 4. To distinguish one slice in the slab from the next, a series of secondary phase encode gradients are applied, for each primary phase encode increment in the x-direction. That is, the slab excitation pulse Gz is followed by a second gradient pulse in the z-direction which is turned on and then off before read-out takes place, the gradient stepping from a negative value through several increments to a positive value. Typically, there would be 32 such increments. Typically, TR would be around 10 ms. Thus, for one x increment, the time required would be around 320 ms to run through the slice select phase encoding gradients.

The entire volume would be run through in a period 256 times as long, to allow each of the x phase increments to be executed. In other words, the whole volume shown in FIG. 4 would be scanned on this basis in around 80 seconds.

Figures 6A, 6B:
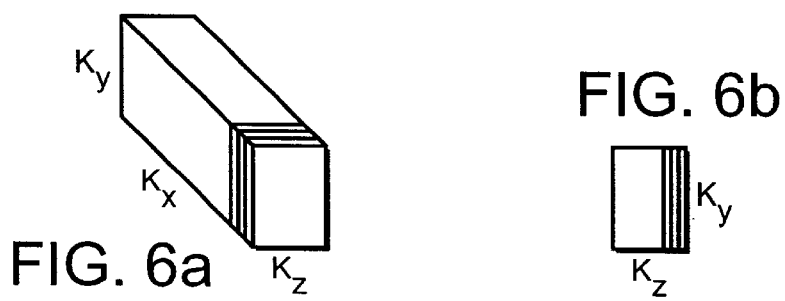

The time varying echo samples do not directly represent hydrogen nuclei distribution, but fill a three-dimensional array in so-called k-space shown in FIG. 6a, where dimension Ky represents frequency and dimension Kx and Kz represent frequency synthesised from phase encoding. Referring to FIG. 6b, which shows one of the slices of the array 6a, each echo signal produces a series of points on one vertical line Ky, and a fresh vertical line is produced at each Kz phase encode increment.

The k-space of FIG. 6a is converted to a representation of the distribution of hydrogen nuclei in real space in digital signal processor 13, by separable Fourier transformation along each of the x,y and z axis.

The relationship between real space and k-space can be further explained by reference to FIG. 7a to 7d. Thus, if one were to imagine that the object being imaged was a square-sided figure, the sides of which are aligned with the x and z-axis in FIG. 3, in fact the k-space representation of this would appear as in FIG. 7b. After Fourier transformation along the z-axis, the representation in hybrid Kx, real z-space would appear as in FIG. 7c, where the array would now consist of points arranged on lines parallel to the z-axis and equal in number to the number of k-phase encode increments. Fourier transformation along the x-axis would yield the square of FIG. 7a.

This correspondence between real space and k-space, and Fourier transformation back to real space is of course well known. However, what is not known is for the patient to be translated through the region of good field 5, in the direction of the axis z, during the process of data collection.

Figure 7A:
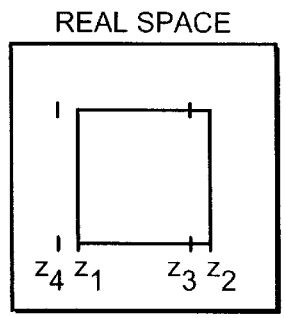
FIG. 7a shows a square object seen in plan view about to pass through the region of good field of the magnetic resonance imaging apparatus of FIG. 3.
Figure 7B:
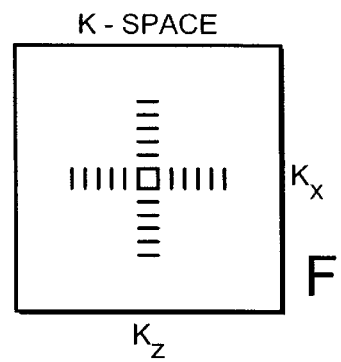
FIG. 7b shows a representation of the object in the x,z plane in k-space.

The effect of this can be considered by reference to FIG. 7a. Let us image that the time taken to step through all the phase encode increments in the z-direction is sufficiently small that the motion of the four-sided figure can be ignored. Then, if $z_1$ and $Z_2$ are the z co-ordinates of the top and bottom limbs of the figure at the first x phase encode increment, say, the most negative, then the top and bottom limbs of the figure will have moved to the position $z_3$, $z_4$ by the time data is collected at the most positive x phase encode increment.

Figure 7C:
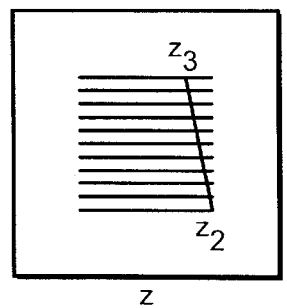
FIG. 7c shows a representation of the object in the x,z plane in the hybrid dimension of k-space and real space.
Figure 7D:
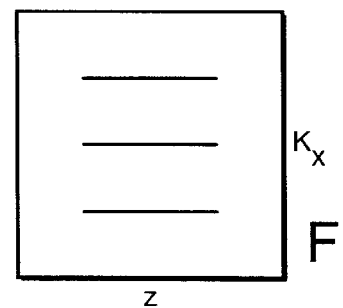
FIG. 7d shows the representation of FIG. 7c but with distortion to the representation in the z-direction for the purposes of explanation.

While the data will still form a three-dimensional matrix with orthogonal axes and will therefore follow the pattern of FIG. 7c, one could distort the representation of FIG. 7c into that of FIG. 7d in order to illustrate the translation which has taken place in the four-sided figure between the most negative primary phase encode increment ($z_2$) and the most positive ($Z_3$).

If one considers FIG. 7c for the case when the four-sided figure is stationary, Fourier transformation in the x-direction to reconstitute the right hand limb of the four-sided figure requires computation using each point at the right hand end of each of the Kx lines. In view of the movement which has taken place while data is being collected, the points which now need to be combined are those under the slant line $z_2,z_3$ in FIG. 7c. Knowledge of the speed of translation of the couch enables this spatial correction to be readily calculated, and this is done in correction means 7. The result of this is that the data in the hybrid space of FIG. 7c can be corrected for the motion of the couch.

In fact, the point $z_3$ in FIG. 7c, as well as representing a displacement related to the speed of movement of the couch, also reflects a phase change dependent upon the speed of the couch. It is then merely necessary, using the Fourier shift theorem, to multiply each point in the k-space array of FIG. 6a by an appropriate phase correction to take account of the translation of the volume while the data was being collected. If this phase correction is made, then the correction can be performed wholly in k-space. The spatial correction discussed with relation to FIG. 7c on the other hand requires that the z-dimension is first of all Fourier transformed to real space. A description of the use of the Fourier shift theorem used for correction of involuntary motion is magnetic resonance imaging is described in Frequency Domain Simulation of MR Tagging, William R Crum et al, JMRI 1998; 8:1040–1050.

Considering the three-dimensional slab of FIG. 4, if the x,z-dimensions coincide with those of the four-sided figure shown in FIG. 7a, if the gradient Gz were arranged to excite the entire volume between $z_1$, and $z_2$, it will be apparent that only the region of the slab between the coordinates $z_1$, and $z_3$ would be fully imaged (all primary and secondary phase encodes acquired), since the region of the slab lying between z-coordinates $z_4$ and $z_1$, would be outside the excitation volume (between $z_1$, and $z_2$) at the end of primary phase encoding.

In reality, the volume to be imaged will extend further in the z-direction than the slab of FIG. 4. Thus, after the first scan has been completed, the volume of the patient originally lying between z-coordinates $z_1$ and $z_2$ has been translated to z-coordinates $z_4$, $z_3$. The volume of the patient lying between z-coordinates $z_1$, and $z_3$ has been imaged, and a fresh volume of the patient between z-coordinates $z_3$ and $z_2$ has now entered the volume which is excited (between $z_1$, and $z_2$). Consequently, after the next scan has been completed, the fresh volume between $z_3$ and $z_2$ is imaged, and so on.

Of course, with the coordinates shown in FIG. 7a, a large proportion of the patient's volume which had been imaged on one scan would be imaged also on the next scan. Duplicated data would be averaged to improve the s:n ratio. Accordingly, the excitation volume and the speed of translation may be chosen so that point $z_3$ moves all the way to point $z_1$ in the time which one scan takes to perform. The volume which is fully imaged on each scan is now just a single slice, and there is no overlap between the volume fully imaged on one scan and the volume fully imaged on the next scan. Continuous imaging of a patient on the couch 3 moving through the region of good field takes place, and the result is a continuous seamless length of time 3D image data.

Figure 8:
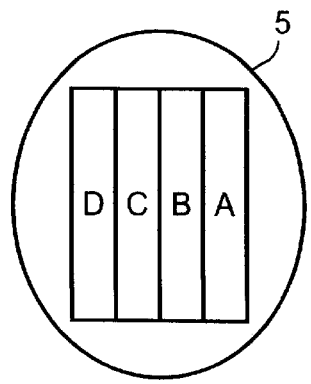
FIG. 8 is a plan view of slabs of a data collection volume passing through the region of good field in FIG. 3.

It turns out that a certain amount of overlap between successively imaged volumes can in fact be desirable. Thus, the scheme is most sensitive to errors where the join in the realigned data in hybrid $Zk_x$ space is close to the central $K_x=0$. To guard against artifacts produced by errors in this region it is helpful to use data interpolation to ensure a smooth join or to double collect data so that the central $k_x$ data always comes from a narrow range of positions within the slab. This can be achieved by making the translation velocity smaller so that a distance less than $Z_1$ to $Z_3$ is traversed in the time taken to acquire all primary and secondary phase encode steps, or by acquiring the central $k_x$ lines twice, for example if sequentially ordered phase encoding is used the central lines would be acquired in the natural order and again at the end of the series. As another alternative, referring to FIG. 8, which is a plan view of four slabs A, B, C, D, successive frequency offsets could be applied to the frequency of the r.f. pulse, so that in the first data collection, the data in volume A was collected. The frequency the r.f. pulse could then be offset to collect data in volume B. It could then be offset of collect data in volume C. It could then be offset to collect data in volume D. The r.f. frequency could then be reset to collect data in volume A again etc.

It is possible that there would be discontinuities between the slabs produced in this method. This could be reduced by "walking" a thin slab along the z-axis continuously while acquiring data in an interleaved fashion along the Ky axis (Sliding Interleaved ky (SLINKY) Acquisition: A Novel 3D MRA Technique with Suppressed Boundary Artifact, JMRI 1998, Volume 8, No. 4, pages 903 to 911, and European Patent Application No. 98308921.0).

The above discussion has taken place with the assumption that the motion of the object being imaged is insignificant over one run through of all the secondary phase encode gradients. The assumption holds provided that the sloping line in FIG. 7c does not cross the second from the bottom primary phase encode line beyond the second data point of that line. However, the effects of the couch motion while a single run through of secondary phase encode data takes place can in fact be corrected for. In the same way that the motion between the lines was visualised in FIG. 7c, the motion during a line could be visualised in FIG. 7c by slightly displacing each of the points forming a z line. In other words, a velocity correction could be applied to each point, for example, in the form of a phase correction.

It has been assumed that a separate r.f. pulse is required for each secondary phase encode increment. Of course, it would be possible for a multi-echo sequence to be used, so that a different secondary phase encode gradient was applied before each repeated echo. Suitable pulse trains would be of the generic form termed multi-shot echo planar imaging with a secondary phase encode or multi-shot echo volumar imaging.

The description has referred to data being assembled in orthogonal arrays in what would be Cartesian coordinates, but the manipulation of the data could equally take place in polar coordinates.

The invention is particularly applicable to magnets having only a narrow region of good field in the z-direction eg. maximum thickness of 3 cms. This would apply particularly to shorter magnets. While an annular magnet has been described, the invention is also applicable to other geometries for example C-magnets and including permanent magnets.

The invention is of course applicable to slice select and phase encode gradients being in the x or y or oblique directions, with appropriate changes to the motion of the volume to be imaged. This invention can also include correction for spatial distortions introduced by main field inhomogeneity and/or gradient non-linearity. The correction could take the form of a real space unwarping or a k space-regridding.

While a particular feature of the invention may have been described above with respect to only one of the illustrated embodiments, such features may be combined with one or more other features of other embodiments, as may be desired and advantageous for any given particular application.

From the above description of the invention, those skilled in the art will perceive improvements, changes and modification. Such improvements, changes and modification within the skill of the art are intended to be covered by the appended claims.

Having described a preferred embodiment of the invention, the following is claimed:

1. A magnetic resonance imaging apparatus having a main magnetic field, the apparatus comprising:
    means for applying r.f. excitation pulses to, and collecting volumetric data samples from, a restricted region of the main field of the apparatus;
    means for transforming the data samples to form a volumetric image of the restricted region;
    means for advancing a patient support continuously through the restricted region; and
    means for encoding volumetric data samples with secondary phase encoding in the direction of motion of the patient support; and
    means for correcting the data samples to compensate for the motion so that the volumetric image formed is of greater length than that of the restricted region.

2. The magnetic resonance imaging apparatus of claim 1 including means for encoding the volumetric data samples with primary encoding in a transverse direction.

3. The magnetic resonance imaging apparatus of claim 1 wherein the correcting means compensates successive sets of samples of all secondary phases produced at each primary phase for the motion.

4. The magnetic resonance imaging apparatus of claim 2 wherein the correction means is arranged to apply a motion correction to rows of data samples in hybrid real space/k-space.

5. The magnetic resonance imaging apparatus of claim 2 wherein the correction means applies a phase correction to rows of data samples in k-space.

6. The magnetic resonance imaging apparatus of claim 2, wherein the means for encoding the volumetric data samples with primary phase encoding has a greater number of increments than the secondary phase encoding.

7. The magnetic resonance imaging apparatus of claim 2, wherein the correcting means compensates all samples individually.

8. A method of magnetic resonance imaging, the method comprising the steps of:
    encoding the volumetric data samples with secondary phase encoding in the direction of motion of the patient support;
    applying r.f. excitation pulses to, and collecting volumetric data samples from, a restricted region of a main magnetic field;
    transforming the data samples to form a volumetric image of the restricted region;
    advancing a patient support continuously through the restricted region; and
    correcting the data samples to compensate for the motion so that the volumetric image formed is of greater length than that of the restricted region.

9. The method of magnetic resonance imaging of claim 8 including the step of encoding the volumetric data samples with primary phase encoding in a transverse direction.

10. The method of magnetic resonance imaging of claim 8 wherein the step of correcting includes the step of compensating successive sets of samples of all secondary phases produced at each primary phase for the motion.

11. The method of magnetic resonance imaging of claim 9 wherein the step of correcting includes the step of applying a motion correction to rows of data samples in hybrid real space/k-space.

12. The method of magnetic resonance imaging of claim 9 wherein the step of correcting includes the step of applying a phase correction to rows of data samples in k-space.

13. The method of magnetic resonance imaging of claim 9, wherein the step of encoding the volumetric data samples with primary phase encoding has a greater number of increments than the secondary phase encoding.

14. The method of magnetic resonance imaging of claim 9, wherein the step of correcting compensates all samples individually.

15. A magnetic resonance apparatus comprising:
    a bore for receiving a patient;
    a main field magnet disposed around the bore for generating a main magnetic field within the bore, the main magnetic field including at least a portion located in a restricted region of the bore;
    a patient support and transport couch for moving a patient through the restricted region of the bore during imaging;
    means for advancing the patient support continuously through the restricted region;
    a radio frequency coil disposed around the bore for applying radio frequency pulses and collecting volumetric data samples;
    a gradient field control connected to a gradient coil assembly for creating a primary phase encode gradient, a frequency encode gradient in a direction transverse to the direction of motion of the patient support and a secondary phase encode gradient to be used to compensate for patient motion through the restricted region of the bore; and
    a reconstruction processor for transforming the data samples into a volumetric image that corresponds to a portion of the patient having a length greater than that of the restricted region.

16. The magnetic resonance apparatus of claim 15 wherein the reconstruction processor compensates for patient motion by adjusting data values in hybrid real space/k-space.

17. The magnetic resonance apparatus of claim 15 wherein the secondary phase encoding is in the direction of motion of the patient support and the primary phase encoding is in a direction transverse to the motion of the patient support.

18. The magnetic resonance apparatus of claim 15 wherein the reconstruction processor includes a correction processor to compensate the data samples for patient motion through the restricted region.

19. The magnetic resonance apparatus of claim 18 wherein the correction processor compensates the data samples in k-space.

20. The magnetic resonance apparatus of claim 18 wherein a velocity correction to compensate for patient motion by the correction processor is achieved by applying a phase correction factor.

* * * * *